(12) United States Patent
Clemens et al.

(10) Patent No.: US 9,359,669 B2
(45) Date of Patent: Jun. 7, 2016

(54) METHOD FOR IMPROVED CATHODIC ARC COATING PROCESS

(75) Inventors: Reade R. Clemens, Plainville, CT (US); Neil B. Ridgeway, South Windsor, CT (US)

(73) Assignee: United Technologies Corporation, Hartford, CT (US)

(*) Notice: Subject to any disclaimer, the term of this patent is extended or adjusted under 35 U.S.C. 154(b) by 0 days.

(21) Appl. No.: 13/315,859

(22) Filed: Dec. 9, 2011

(65) Prior Publication Data

US 2013/0146454 A1 Jun. 13, 2013

(51) Int. Cl.
*C23C 14/06* (2006.01)
*C23C 14/34* (2006.01)
*C23C 14/32* (2006.01)

(52) U.S. Cl.
CPC ............ *C23C 14/3414* (2013.01); *C23C 14/325* (2013.01)

(58) Field of Classification Search
CPC ....................................................... C23C 14/06
USPC .......................................... 374/429; 148/437
See application file for complete search history.

(56) References Cited

U.S. PATENT DOCUMENTS

| 4,559,125 | A | 12/1985 | Mularie |
| 5,298,136 | A | 3/1994 | Ramalingam |
| 5,895,559 | A | 4/1999 | Christy |
| 5,932,078 | A | 8/1999 | Beers et al. |
| 6,036,828 | A | 3/2000 | Beers et al. |
| 6,103,074 | A | 8/2000 | Khominich |
| 6,224,726 | B1 | 5/2001 | Beers et al. |
| 6,233,822 | B1 | 5/2001 | Grossklaus, Jr. et al. |
| 6,284,390 | B1 | 9/2001 | Bose et al. |
| 6,929,727 | B2 | 8/2005 | Gorokhovsky |
| 7,214,409 | B1 | 5/2007 | Kasule |
| 7,879,203 | B2 | 2/2011 | Weaver et al. |
| 2002/0174917 | A1* | 11/2002 | Segal et al. ................... 148/437 |
| 2008/0138529 | A1 | 6/2008 | Weaver et al. |
| 2009/0191422 | A1 | 7/2009 | Tryon et al. |
| 2009/0258165 | A1 | 10/2009 | Tryon et al. |
| 2009/0290614 | A1* | 11/2009 | Gregory et al. ................. 374/29 |

FOREIGN PATENT DOCUMENTS

| CN | 101310972 A | 11/2008 |
| EP | 2110457A2 A2 | 10/2009 |

OTHER PUBLICATIONS

"Refractory Metals" W.M. Haynes, CRC Handbook of Chemistry and Physics, 93rd Edition.*
The extended European Search Report in counterpart European Application No. 12196365.6 filed Dec. 10, 2012.
(Continued)

*Primary Examiner* — Keith Hendricks
*Assistant Examiner* — Timon Wanga
(74) *Attorney, Agent, or Firm* — Kinney & Lange, P.A.

(57) ABSTRACT

A method of forming targets for cathodic arc deposition of alloy bond coats for turbine engines components consists of melting a base alloy containing aluminum and other metals, adding grain boundary strengthening alloy additions, and casting the melt to form a cylindrical billet that is subsequently sectioned into puck shaped targets. The grain boundary strengthening additions minimize intergranular fracture of the targets during high current operation of the arc coating process.

3 Claims, 1 Drawing Sheet

(56) References Cited

OTHER PUBLICATIONS

Jiang, S.M. et al. "Preparation and hot corrosion behaviour of a MCrAlY+AlSiY composite coating" Corrosion Science vol. 50, No. 11, Nov. 1, 2008. pp. 3213-3220.

Pint, B.A. et al. Deformation and Phase Transformations during the Cyclic Oxidation of Ni—Al and Ni—Pt—Al. JOM vol. 58, No. 1, Jan. 1, 2006. pp. 47-52.

* cited by examiner

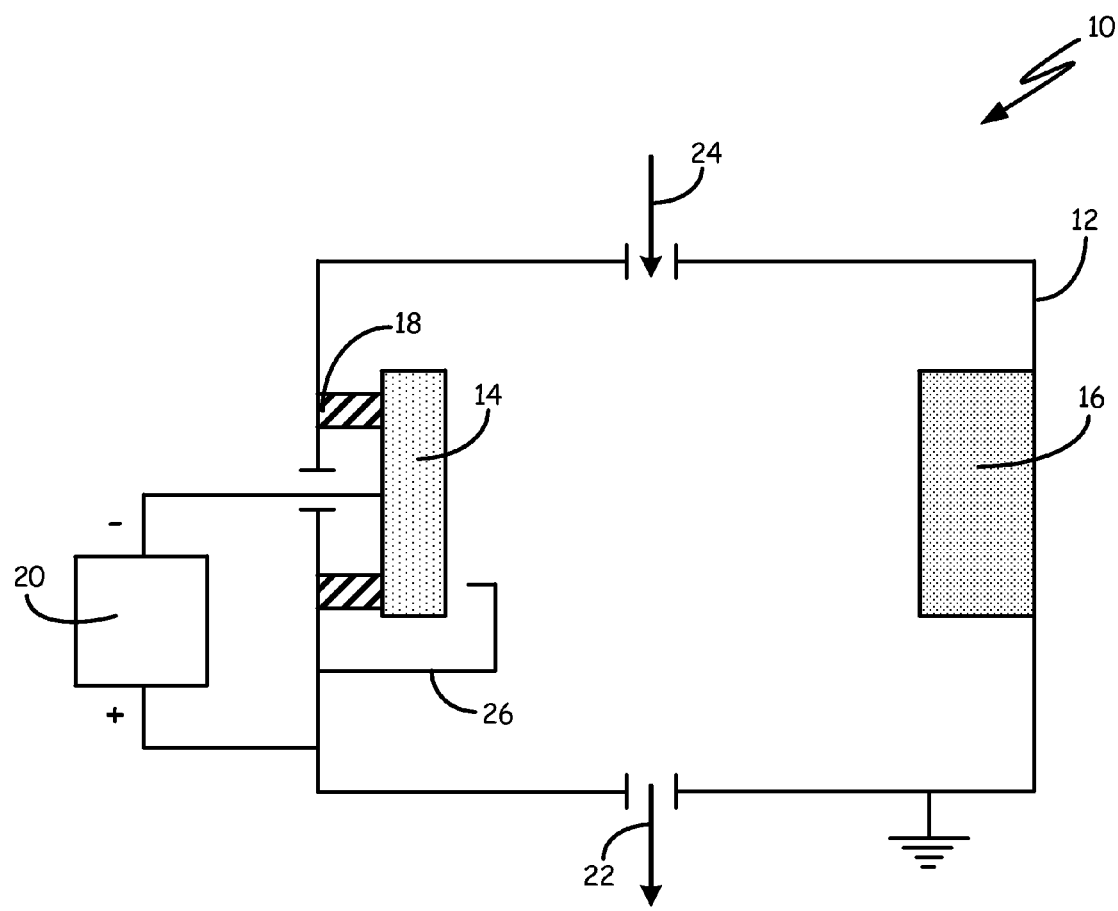

METHOD FOR IMPROVED CATHODIC ARC COATING PROCESS

BACKGROUND

A gas turbine engine typically includes an inlet, a compressor, a combustor, a turbine, and an exhaust duct. The compressor draws in ambient air and increases its temperature and pressure. Fuel is added to the compressed air in the combustor, where it is burned to raise gas temperature thereby imparting energy to the gas stream. To increase gas turbine engine efficiency, it is desirable to increase the temperature of the gas entering the turbine stages. This requires the first stage turbine engine components (e.g. vanes and blades) to be able to withstand the thermal and oxidation conditions of the high temperature combustion gas during the course of operation.

To protect turbine engine components from the extreme conditions, such components typically include metallic coatings (e.g. aluminides and MCrAlY coatings) that provide oxidation and/or corrosion resistance. The metallic coatings may also function as bond coats to adhere thermal barrier coatings to the substrates of the turbine engine components. Existing bond coats are applied to turbine engine components using a variety of deposition techniques (e.g. plasma spraying, cathodic arc plasma deposition, pack cementation, and chemical vapor deposition techniques). The ceramic thermal barrier coatings are then applied over the bond coats to thermally insulate the turbine engine component from the extreme operating conditions. Each bond coat deposition technique offers challenges that, unless resolved, can lead to quality, throughput, and expense issues for the finished product.

SUMMARY

A method of forming targets for cathodic arc deposition of alloy bond coats for turbine engine components consists of melting a first base alloy containing aluminum and other metals, adding grain boundary strengthening alloy additions to the melt, and casting the melt to form a billet that is subsequently sectioned into targets. The grain boundary strengthening additions minimize intergranular separation of the targets during cathodic arc deposition.

BRIEF DESCRIPTION OF THE DRAWINGS

FIG. 1 is a schematic representation of a cathodic arc deposition system.

DETAILED DESCRIPTION

Under conditions of high deposition rates in cathodic arc deposition of alloy bond coats, temperature gradients in the near surface region of the cathodic arc target can generate internal stresses that may result in intergranular separation and ultimate fracture of the target. The invention teaches the addition of grain boundary strengthening alloy additions to the target material to suppress cracking during cathodic arc deposition.

Cathodic arc deposition involves a source material and a substrate to be coated in an evacuated deposition chamber containing a relatively small amount of gas. A schematic of cathodic arc deposition system is shown is FIG. 1. Deposition system 10 comprises chamber 12, source material 14, and substrate 16. The negative lead of direct current (DC) power supply 20 is attached to source material 14 (hereinafter referred to as the "cathode") and the positive lead is attached to an anodic member, usually chamber 12 itself. Cathode 14 is insulated from chamber 10 by insulators 18. An arc initiating trigger 26 at or near the source electrical potential of the anode contacts cathode 14 and moves away from cathode 14 initiating an arc that extends between the cathode and anodic chamber 12. System 10 further comprises vacuum connection 22 and gas inlet port 24. The arc, or cathode spot where it contacts the cathode, moves randomly about the surface of cathode 14 in the absence of a steering mechanism. State of the art cathodic arc deposition equipment has features that both contain and steer the arc for efficient plasma deposition. The energy deposited by the arc at a cathode spot is intense; on the order of $10^5$ to $10^7$ amperes per square centimeter with a duration of a few to several microseconds.

The intensity of the energy raises the local temperature of the cathode spot to approximately equal that of the boiling point of the cathode material (at the evacuated chamber pressure). As a result, cathode material at the cathode spot vaporizes into a plasma containing atoms, molecules, ions, electrons, and particles. Positively charged ions liberated from the cathode are attracted to any object within the deposition chamber having a negative electrical potential relative to the positively charged ion. Some deposition processes maintain the substrate to be coated at the same electrical potential as the anode. Other processes use a biasing source to lower the potential of the substrate and thereby make the substrate relatively more attractive to the positively charged ions. In either case, the substrate becomes coated with the vaporized material liberated from the cathode.

As a result of the thermal intensity of the cathode spot during cathodic arc deposition, cathodes are directly or indirectly cooled to maintain reasonable thermal environments in the deposition chamber. Thermal gradients between the evaporating surface at the cathode spot and underlying cathode body and the resulting internal stress gradient may be sufficient to encourage high temperature grain boundary separation in the cathode material. Prolonged exposure to a high temperature tensile stress field may allow grain boundary cracks to reach a critical size resulting in catastrophic fracture of the cathode. High deposition rate coating resulting in higher temperature gradients exacerbates the problem. It is an object of the present invention to minimize or eliminate wasteful preliminary fracture of cathodic arc targets during deposition of bond coats on turbine components.

As noted earlier, bond coats are protective metallic coatings that provide oxidation and/or corrosion resistance to protect components from the extreme operating conditions existing in the hot gas path of a turbine engine. The bond coats supply aluminum to the interface between the superalloy substrate and a ceramic thermal barrier coat that maintains a protective aluminum oxide layer that inhibits oxidation of the substrate and outward diffusion of the alloying elements from the superalloy into the coating.

Common bond coats are MCrAlY bond coats such as those disclosed in commonly owned U.S. Pat. No. 6,284,390 and U.S. Appl. No. 2009/0191422 and incorporated by reference herein in their entirety. As used herein, the term "M" in MCrAlY may be nickel, chromium, iron, or mixtures thereof. Examples include NiCrAlY, CoCrAlY, FeCrAlY, NiCoAlY, NiFeAlY, NiCoCrAlY alloys and mixtures thereof.

Platinum additions to a MCrAlY bond coat are beneficial in that platinum is a slower diffusion species than aluminum and acts to prolong the bond coat and protective aluminum oxide layer lifetime. MCrAlYPt alloy examples include NiCrAlYPt, CoCrAlYPt, FeCrAlYPt, NiCoAlYPt, NiFeAlYPt, NiCoCrAlYPt and mixtures thereof.

Other additions to MCrAlY and Pt modified MCrAlY bond coat alloys may include hafnium, silicon, tantalum, tungsten, rhenium, zirconium, niobium, titanium, and molybdenum.

Examples of suitable concentrations for MCrAlY alloys include Cr concentrations from about 4 wt. % to about 25 wt. %, Al concentrations from about 5 wt. % to about 20 wt. %, Y concentrations from about 0.1 wt. % to about 2 wt. %, and the balance being Ni, Fe, or Co.

In another embodiment, the bond coat may be a nickel platinum aluminum hafnium bond coat as described in commonly owned U.S. Pat. No. 7,214,409, and incorporated by reference herein in its entirety.

Cathodic arc deposition targets may be formed by pressing metal powder, in particular hot isostatic pressing of powder, casting and other processes known in the art. In an embodiment, a preferred method is casting, in particular vacuum induction melting (VIM) during which the MCrAlY alloy is melted in a vacuum and then cast into a, preferably, cylindrical mold. Following casting, the ingot may be optionally hot isostatically pressed (HIP) at a temperature of about 1200° C.

Techniques for applying metallic bond coats by cathodic arc plasma vapor deposition are discussed in U.S. Pat. Nos. 5,932,078; 5,972,185; 6,036,825; and 6,224,726, all of which are incorporated by reference herein.

Production lots of cathodic arc target alloy material are in the form of cast bars. Due to the inherent hardness of cast MCrAlY, puck shaped targets are wire saw cut from the bars and installed in cathodic arc deposition equipment. During MCrAlY bond coat deposition, the surface temperature of the target will exceed the melting point even with cooling systems operating.

In platinum modified MCrAlY deposition, platinum can be introduced to the target in a number of ways. First, platinum can be introduced to the melt before casting. This results in homogeneous platinum distribution in the deposited coating. In other ways, platinum can be added to the top surface of an MCrAlY target as a coating. The platinum coating may be formed on the target surface using a variety of techniques such as electroplating processes and physical vapor deposition techniques. Examples of suitable platinum coating thicknesses include thicknesses ranging from about 1 micron to about 20 microns. Following deposition of the platinum layer, the target is then heat treated to at least partially diffuse the platinum into the MCrAlY alloy. Examples of suitable temperatures for the high temperature diffusion anneal process include temperatures ranging from about 930° C. to about 1100° C. Suitable heat treat durations include at least about 1 hour to about 4 hours. It is desirable to perform the diffusion anneal in a reduced pressure inert environment or vacuum. Adding platinum via a diffusion anneal results in a sharper concentration gradient with higher platinum at the surface and decreasing with depth below the surface of the target.

It is the purpose of the present invention to strengthen the grain boundaries of MCrAlY bond coat targets during high temperature cathodic arc deposition. With the present invention alloying elements are added to the cathodic targets to strengthen grain boundaries in the target. Examination of fracture surfaces of broken MCrAlY targets indicated a number of features. The fracture surface morphology always included grain boundary facets as well as transgranular fracture. It is suggested that, at the temperatures existing near the target surface during deposition, some grain boundaries separated due to the thermally induced stress field in the target. The grain boundary cracks then grew under the stress field until a point was reached where the stress concentration at the crack tip exceeded the critical stress intensity factor (i.e. the fracture toughness) and the fracture proceeded in a catastrophic transgranular fashion. The fracture origin is presumably related to low grain boundary strength in the near surface regions of the target during deposition.

Alloying elements that can perform this function are zirconium, boron, magnesium, calcium, cerium, and lanthanide series elements. In particular, additions of about 0.01 wt. % to about 0.20 wt. % Zr, more particularly additions of about 0.04 wt. % to about 0.12 wt. % Zr, additions of about 0.005 wt. % to about 0.03 wt. % B, more particularly additions of about 0.01 wt. % to about 0.02 wt. % B, additions of about 5 ppm to about 300 ppm Mg, more particularly about 10 ppm to about 200 ppm Mg, additions of about 5 ppm Ca to about 300 ppm Ca, more particularly about 10 ppm to about 200 ppm Ca, additions of about 2 ppm Ce to about 50 ppm Ce and additions of about 5 ppm La to about 50 ppm La.

With the above alloying additions, high temperature grain boundary separation and eventual fracture of expensive MCrAlY and other alloy cathodic arc targets is delayed or prevented resulting in increased product throughput.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A cathodic arc cathode formed by melting and casting alloys consisting of a first base alloy and second grain boundary strengthening alloy addition to the first base alloy;
    wherein the first base alloy is selected from the group consisting of NiCrAlY, CoCrAlY, FeCrAlY, NiCoCrAlY, FeCoCrAlY, and mixtures thereof or NiCrAlYPt, CoCrAlYPt, FeCrAlYPt, NiCoCrAlYPt, FeCoCrAlYPt, and mixtures thereof; and
    wherein the second grain boundary strengthening alloy additions to the first base alloy are selected from the group consisting of about 0.04 to about 0.12 wt. % Zr, about 0.01 to about 0.1 wt. % B, about 10 to about 200 ppm Mgm about 10 to about 200 ppm Ca, about 2 to about 50 ppm Ce and about 5 to about 50 ppm La.

2. The material source of claim 1 wherein the cathode is formed from molten first base alloy and molten second grain boundary strengthening alloy additions by casting in a mold to form a billet.

3. A
    cathodic arc cathode formed by melting and casting alloys consisting of a first base alloy, second grain boundary strengthening alloy additions to the first base alloy, and third alloy additions to the first base alloy;
    wherein the first base alloy is selected from the group consisting of NiCrAlY, CoCrAlY, FeCrAlY, NiCoCrAlY, FeCoCrAlY, and mixtures thereof or NiCrAlYPt, CoCrAlYPt, FeCrAlYPt, NiCoCrAlYPt, FeCoCrAlYPt, and mixtures thereof;
    wherein the second grain boundary strengthening alloy additions to the first base alloy are selected from the group consisting of about 0.04 to about 0.12 wt. % Zr, about 0.01 to about 0.1 wt. % B, about 10 to about 200 ppm Mg, about 10 to about 200 ppm Ca, about 2 to about 50 ppm Ce and about 5 to about 50 mmp La; and
    wherein the third alloy additions to the base alloy selected from the group consisting of Hf, Si, Ta, W, Rh, Zr, Nb, Ti, and Mo.

* * * * *